(12) United States Patent
Funayama et al.

(10) Patent No.: US 8,451,614 B2
(45) Date of Patent: May 28, 2013

(54) MODULE AND ELECTRONIC DEVICE

(75) Inventors: Takahisa Funayama, Musashino (JP);
Nobuhiro Yamamoto, Fussa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 148 days.

(21) Appl. No.: 13/034,520

(22) Filed: Feb. 24, 2011

(65) Prior Publication Data

US 2011/0242781 A1    Oct. 6, 2011

(30) Foreign Application Priority Data

Mar. 30, 2010 (JP) ................................. 2010-078859

(51) Int. Cl.
*H05K 7/00* (2006.01)
(52) U.S. Cl.
CPC ........................................ *H05K 7/00* (2013.01)
USPC .......................................... 361/760; 174/260
(58) Field of Classification Search
CPC ........................ G01R 31/2853; G01R 31/31717
USPC ................. 174/260, 261; 361/782, 767, 777, 361/760
See application file for complete search history.

(56) References Cited

U.S. PATENT DOCUMENTS

| | | | | |
|---|---|---|---|---|
| 4,812,742 | A * | 3/1989 | Abel et al. | 324/537 |
| 6,288,346 | B1 * | 9/2001 | Ojiri et al. | 174/260 |
| 6,448,636 | B2 * | 9/2002 | Suenaga et al. | 257/678 |
| 7,932,517 | B2 * | 4/2011 | Negishi | 257/48 |

FOREIGN PATENT DOCUMENTS

| | | |
|---|---|---|
| JP | 05-121513 | 5/1993 |
| JP | 11-87003 | 3/1999 |
| JP | 11-260878 | 9/1999 |
| JP | 2003-004794 | 1/2003 |
| JP | 2009-216391 | 9/2009 |
| JP | 2009-257863 | 11/2009 |
| JP | 2009257863 | * 11/2009 |

OTHER PUBLICATIONS

Japanese Patent Application No. 2010-078859; Notice of Reasons for Rejection; Mailed Apr. 19, 2011 (English translation).

* cited by examiner

*Primary Examiner* — Yuriy Semenenko
(74) *Attorney, Agent, or Firm* — Blakely, Sokoloff, Taylor & Zafman LLP

(57) ABSTRACT

According to one embodiment, a module includes a circuit substrate having a circuit pattern which is formed of a first conductor and which includes a signal circuit, a bonding member formed of a second conductor different from the first conductor, a passive element and an active element bonded to the circuit pattern with the bonding member to implement the circuit substrate, and a detection circuit provided separately from the signal circuit on the circuit substrate. The detection circuit includes a detector having the first conductor and the second conductor which are provided on the circuit substrate and which are electrically connected to each other, a power source configured to supply current to the detector, and a measuring instrument interposed between one of the first and the second conductors in the detector and the power source and configured to measure electrical characteristics between the first and the second conductors.

16 Claims, 7 Drawing Sheets

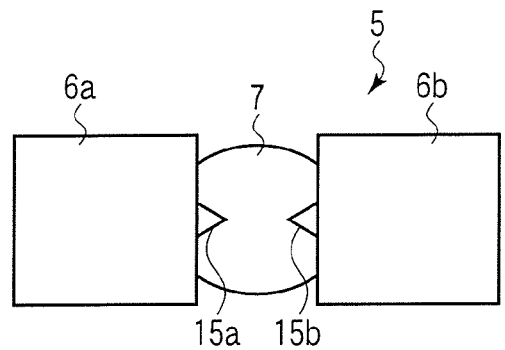
F I G. 9
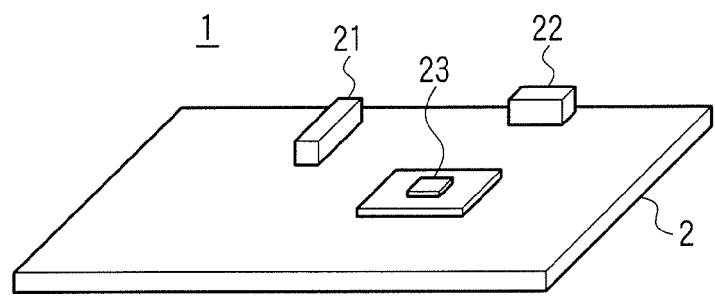
F I G. 10
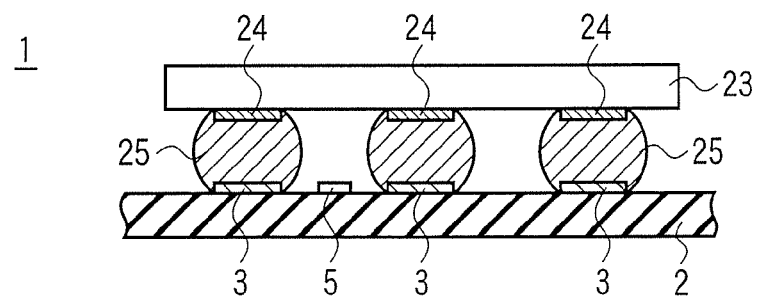
F I G. 11

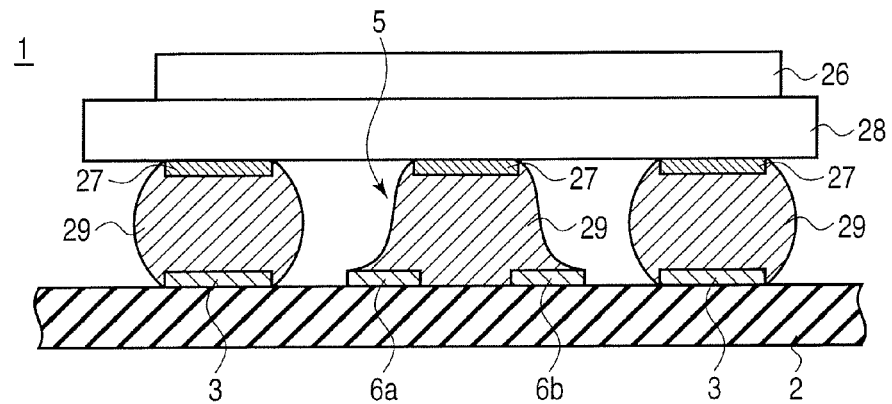
F I G. 12
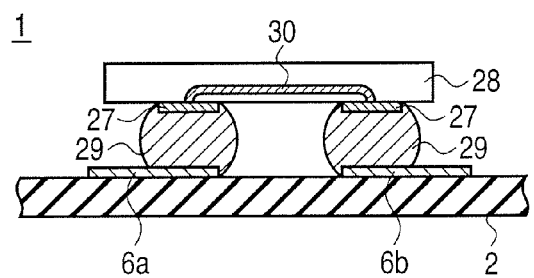
F I G. 13
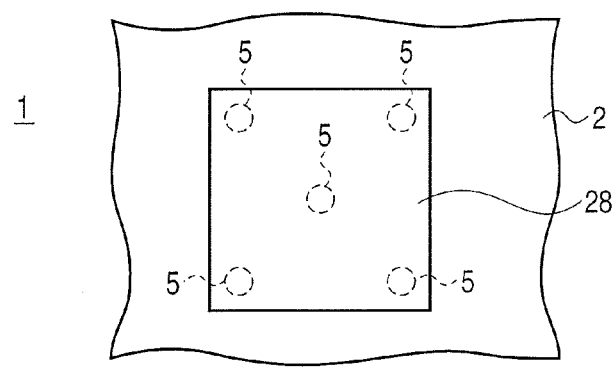
F I G. 14

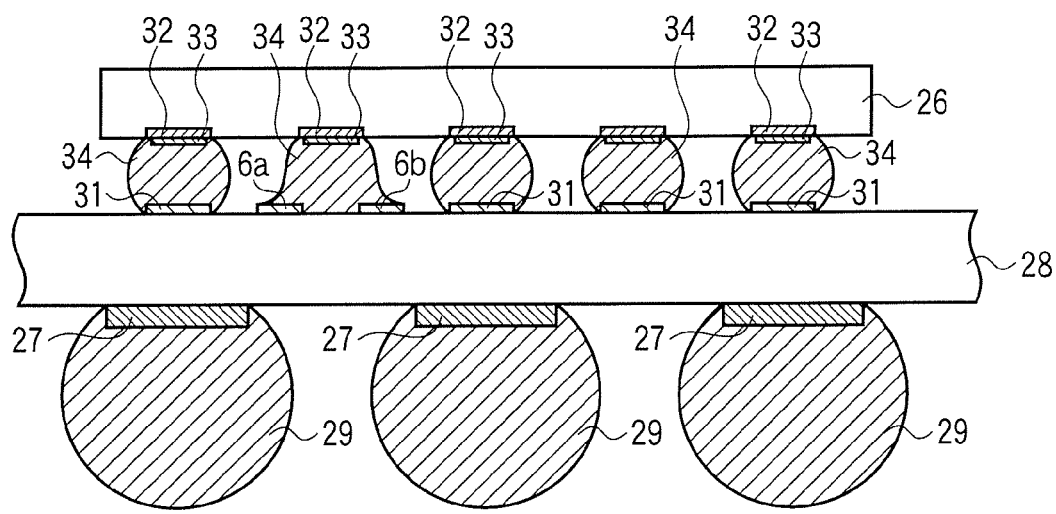
F I G. 15
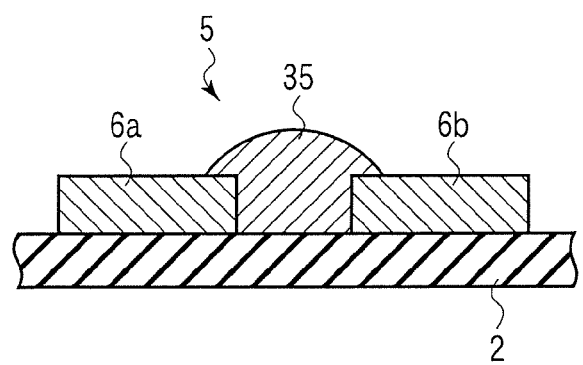
F I G. 16

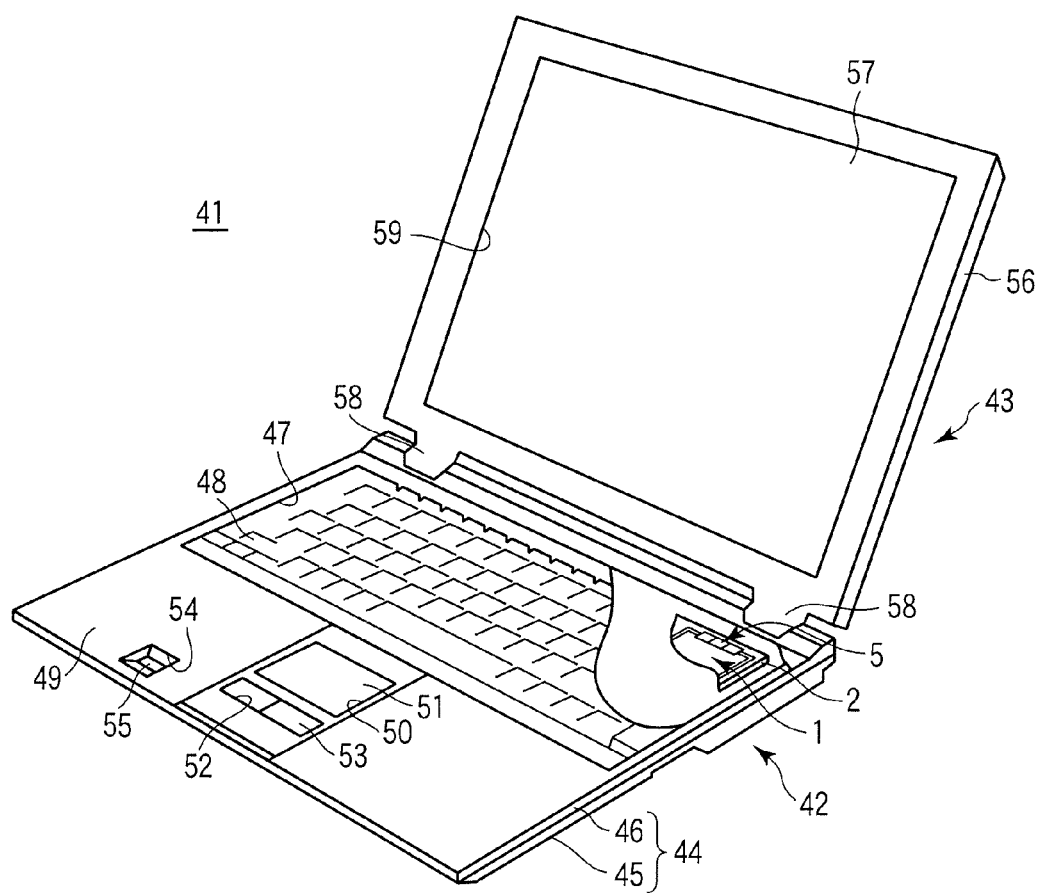
F I G. 17

MODULE AND ELECTRONIC DEVICE

CROSS-REFERENCE TO RELATED APPLICATIONS

This application is based upon and claims the benefit of priority from Japanese Patent Application No. 2010-078859, filed Mar. 30, 2010; the entire contents of which are incorporated herein by reference.

FIELD

Embodiments described herein relate generally to a module and an electronic device.

BACKGROUND

An electronic device, such as a computer, a cellular phone or a video camcorder, has mounted thereon a module which is implemented active elements, such as a CPU or a memory, and passive elements on a circuit substrate. In such an electronic device, when breakage occurs, for example, in a bonding member bonding each element and a circuit pattern of a circuit substrate, important issues such as damage to the CPU or the memory arise.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 9 is a plan view showing another aspect of the detector of the module according to the first embodiment;

FIG. 10 is a perspective view showing another aspect of the module according to the first embodiment;

FIG. 11 is a cross-sectional view of the main part of the module of FIG. 10;

FIG. 12 is a cross-sectional view showing another aspect of the module according to the first embodiment;

FIG. 13 is a cross-sectional view showing a modification of the module of FIG. 12;

FIG. 14 is a plan view showing a modification of the module of FIG. 12;

FIG. 15 is a cross-sectional view showing a modification of the detector of the module according to the first embodiment;

FIG. 16 is a cross-sectional view showing another aspect in the detector of the module according to the first embodiment; and FIG. 17 is a partially cutaway perspective view of the main part of an electronic device according to a second embodiment.

DETAILED DESCRIPTION

Various embodiments will be described hereinafter with reference to the accompanying drawings. In general, according to a first embodiment, a module includes a circuit substrate comprising a circuit pattern which is formed of a first conductor and which comprises a signal circuit, a bonding member formed of a second conductor different from the first conductor, a passive element and an active element bonded to the circuit pattern with the bonding member to implement the circuit substrate, and a detection circuit provided separately from the signal circuit on the circuit substrate. The detection circuit comprises a detector including the first conductor and the second conductor which are provided on the circuit substrate and which are electrically connected to each other, a power source configured to supply current to the detector, and a measuring instrument interposed between one of the first and the second conductors in the detector and the power source and configured to measure electrical characteristics between the first and the second conductors.

The module according to the embodiment is described in detail with reference to the drawings.

Figure 1:
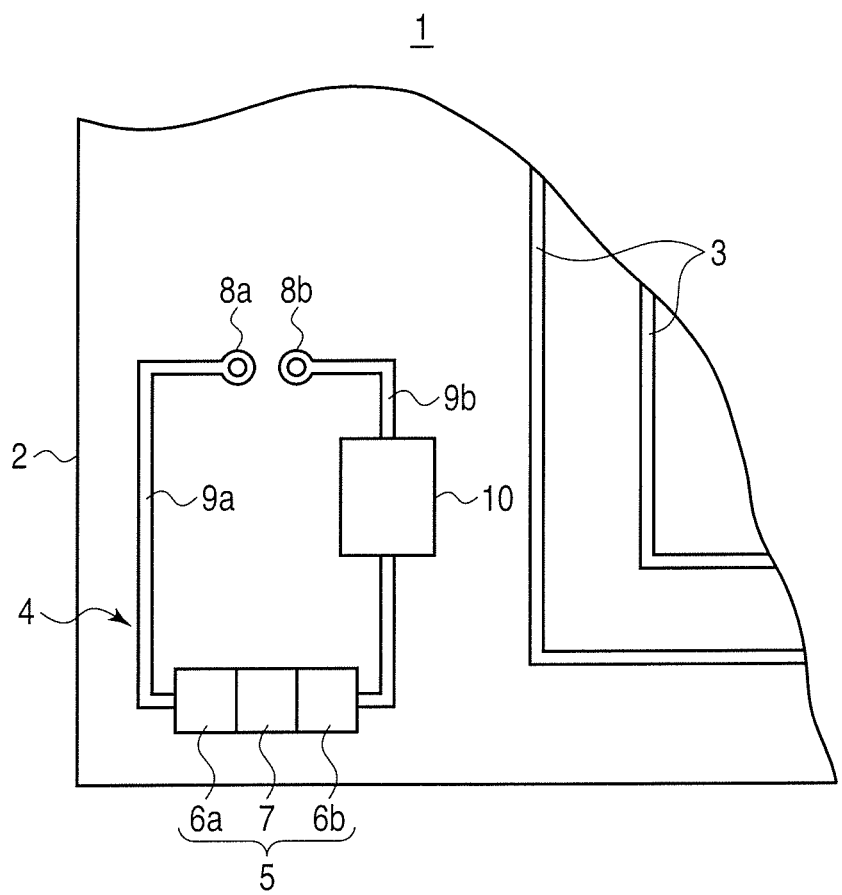
FIG. 1 is a partially cutaway plan view showing the main part of a module according to a first embodiment.
Figure 2:
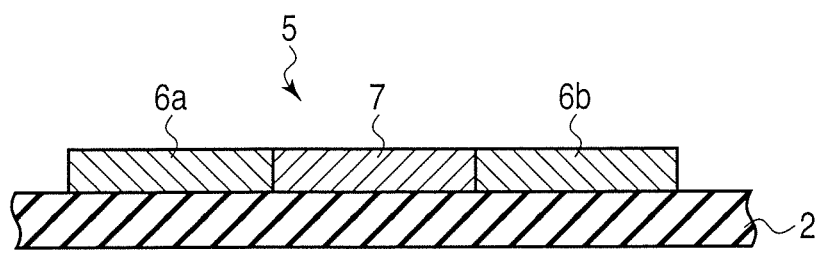
FIG. 2 is a cross-sectional view showing a detector of the module of FIG. 1.
Figure 3:
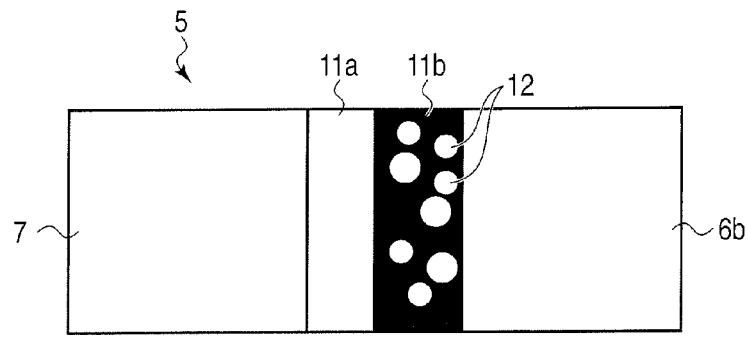
FIG. 3 is a plan view for explaining a factor of breakage in the detector of FIG. 2.
Figure 4:
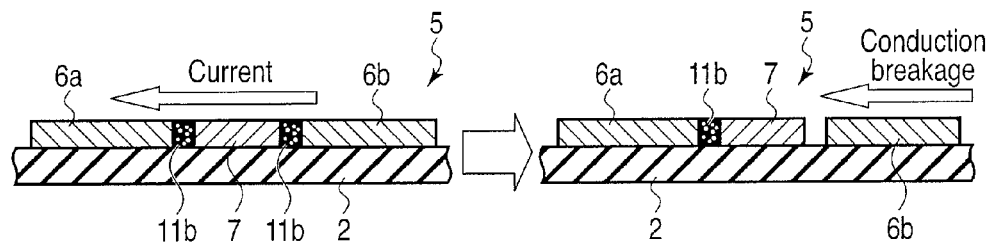
FIG. 4 is a cross-sectional view showing the process leading to breakage in the detector of FIG. 2.

FIG. 1 is a partially cutaway plan view showing the main part of the module according to the embodiment, FIG. 2 is a cross-sectional view showing a detector of the module of FIG. 1, FIG. 3 is a plan view for explaining a factor of breakage in the detector of FIG. 2, and FIG. 4 is a cross-sectional view showing the process leading to breakage in the detector of FIG. 2.

A module 1 comprises a circuit substrate 2. The circuit substrate 2 comprises a circuit pattern 3 formed of a first conductor, e.g., copper (Cu). The circuit pattern 3 comprises a signal circuit. Active elements, such as, for example a central processing unit (CPU), a memory or a ball grid array (BGA), and passive elements (both elements not shown) are bonded to the circuit pattern 3 with bonding members which are formed of a second conductor, e.g., tin alloy solder.

The circuit substrate 2 comprises a detection circuit 4 that is provided separately from the signal circuit. The detection circuit 4 comprises a detector 5. The detector 5 comprises two first conductors 6a and 6b and a second conductor 7 formed on the circuit substrate 2 as shown in FIG. 2. The second conductor 7 is disposed between the first conductors 6a and 6b and is electrically connected with the first conductors 6a and 6b. That is, the first conductor 6a, the second conductor 7 and the first conductor 6b are connected each other in this sequence. The first conductors 6a and 6b are made of the same material as that, i.e., copper, of the circuit pattern 3. The second conductor 7 is made of the same material as that, i.e., tin alloy solder, of the bonding member. The tin alloy solder is metal of a different kind from that of the first conductors 6a and 6b. Examples of tin alloy solder include $Sn_{3.0}Ag_{0.5}Cu$ solder and $Sn_{4.0}Ag_{0.5}Cu$ solder. The first conductor 6a is connected to a land 8a, into which one terminal of a power source (not shown) is inserted, via a circuit pattern 9a which is different from the signal circuit. The first conductor 6b is connected to a land 8b, to which the other terminal of the power source (not shown) is inserted, via a circuit pattern 9b which is different from the signal circuit. The power source supplies current to the detector 5. A measuring instrument 10 is connected to a portion of the circuit pattern 9b located between the first conductor 6b and the land 8b. The measuring instrument 10 is measured electrical characteristics, for example, current which is flowed through the first conductor 6a, the second conductor 7 and first conductor 6b. The measuring instrument 10 is connected to, for example, a CPU mounted on the module 1. A detection signal of the measuring instrument 10 is output to the CPU. Based upon input of the detection signal, the CPU performs operation for backup of data and outputs a signal prompting repair work.

In the module 1 according to the first embodiment, an intermetallic compound layer made of tin and copper is formed in a junction between the second conductor 7 made of tin alloy solder, for example, $Sn_{3.0}Ag_{0.5}Cu$ solder, and the first conductor (e.g., 6b) made of Cu. When current flows from a power source to the first conductors 6a and 6b through the circuit patterns 9a and 9b, Cu and Sn diffuse into each other between the second conductor 7 made of a tin alloy and the intermetallic compound layer, and between the intermetallic compound layer and the first conductor 6b made of copper. This causes by exhibiting different resistance among the second conductor 7, the intermetallic compound layer and the first conductor 6b. Therefore, as shown in FIG. 3, an intermetallic compound layer ($Cu_6Sn_5$ layer) 11a of tin and copper and a metallic compound layer ($Cu_3Sn$ layer) 11b are formed from the second conductor 7 toward the first conductor 6b. At the same time, as shown in FIG. 3, the difference in atom diffusion rate causes Kirkendall voids 12 to be formed in the metallic compound layer ($Cu_3Sn$ layer) 11b. When the diffusion rate of atoms is accelerated, electromigration occurs. The term "electromigration" means a phenomenon in which ions gradually move in an electrical conductor to cause a defect in shape or disconnection of the material. As a result, as shown in FIG. 4, bonding between the second conductor 7 and the first conductor 6b is broken, thereby eliminating conduction. That is, active elements, such as a CPU, a memory or a BGA are implemented by bonding them to the circuit pattern 3 on the circuit substrate 2 using a bonding member made of tin alloy solder. The bonding configuration between the circuit pattern 3 and the bonding member made of tin alloy solder is the same as that of the above-described detector 5 disposed on the circuit substrate 2. For this reason, the breakage situation of the detector 5 reflects the breakage of a junction between the bonding member made of tin alloy solder and the circuit pattern 3, which is taken place in the active elements. Accordingly, detecting the breakage state of the detector 5 by the measuring instrument 10 makes it possible to forecast a failure of the circuit substrate 2 including the junction between the circuit pattern and the bonding member of the active elements, such as a CPU, a memory and a BGA.

To cause breakage between the first and second conductors of the detector 5 before breakage of the junction between the bonding member made of tin alloy solder and the circuit pattern 3 in the active elements takes place, it is preferable that the speed of breakage between the first conductor and the second conductor of the detector is increased, or the detection rate of breakage is increased, as in (1) to (6) to be described later. This makes it possible to more reliably forecast a failure of the circuit substrate 2 including the junction between the circuit pattern and the bonding member of the active elements, such as a CPU, a memory or a BGA.

Figure 5:
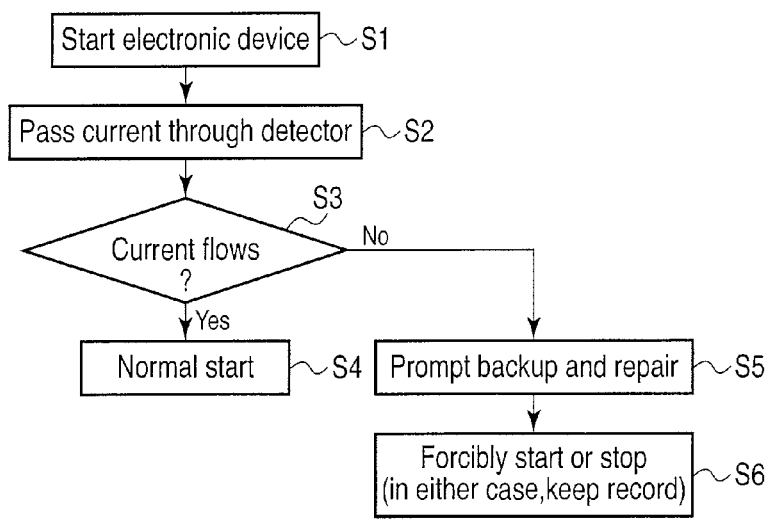
FIG. 5 is a flowchart explaining forecast of a failure of an electronic device on which the module of FIG. 1 is mounted.

Determination and the like of the detection circuit when the module according to the first embodiment is mounted on an electronic device are described with reference to a flowchart shown in FIG. 5.

When the start of the electronic device is input from the outside in step S1, electric current is passed through the detector 5 of the detection circuit 4 (step S2). If the result of step S3 is YES (current flows through the measuring instrument 10), the start is determined as normal start in step S4. If the result of step S3 is NO (current does not flow through the measuring instrument 10), a detection signal of the measuring instrument 10 is output to the CPU of the electronic device in step S5. As a result, the operation for backup of data of the CPU is performed, and a signal prompting repair work is output. Then, in step S6, forced starting or stopping is performed (in either case, keep a record).

As described above, in the module 1 according to the first embodiment, the circuit substrate 2 is provided with the above-described failure forecast structure, that is, the detection circuit 4, which enables forecast of a failure of the circuit substrate including the junction between the circuit pattern and the bonding member of the active elements, such as a CPU, a memory or a BGA. Therefore, measures such as a data backup or a repair work can be taken before a failure occurs in the active elements, such as a CPU or a memory, to be implemented.

Note that electrical characteristics among the first conductor 6a, the second conductor 7 and the first conductor 6b include, in addition to current, resistance and voltage. In cases where resistance is measured as the electrical characteristic, a resistance measuring instrument is used as the measuring instrument. In cases where a voltage is measured as the electrical characteristic, a voltage measuring instrument is used as the measuring instrument.

Next, other aspects of the detector in the module according to the first embodiment are described with reference to the drawings and the like.

(1) While $Sn_{3.0}Ag_{0.5}Cu$ solder or $Sn_{4.0}Ag_{0.5}Cu$ solder has been used as a material (tin alloy solder) for the second conductor of the detector, $Sn_{3.5}Ag$ solder may be used. This solder does not contain Cu. For this reason, in bonding between a second conductor made of $Sn_{3.5}Ag$ solder and a first conductor made of Cu, the speed of diffusion of Cu from the first conductor to the second conductor increases. That is, the growth of the intermetallic compound layer between the first conductor and the second conductor becomes faster. Therefore, formation and growth of Kirkendall voids are promoted, which increases the speed of breakage of a junction between the conductors. Early detection is thus enabled.

Figure 6:
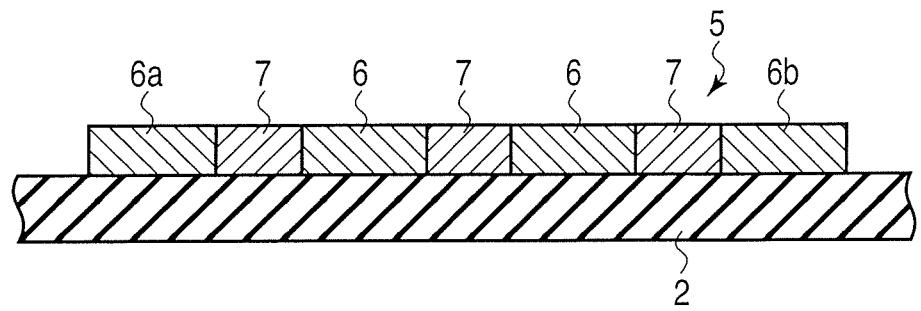
FIG. 6 is a cross-sectional view showing another aspect of the detector of the module according to the first embodiment.

(2) The detector 5 shown in FIG. 6 has a structure in which a plurality of conductors, for example, the second conductor 7, the first conductor 6, the second conductor 7, the first conductor 6 and the second conductor 7, are arranged in series between the above-described first conductors 6a and 6b.

In such detector 5, the number of junctions between the first conductor and the second conductor is larger than that in the above-described manner shown in FIG. 2. Therefore, the detection rate and detection accuracy of breakage of junctions can be improved. For example, assuming that the detection rate of one junction between the first conductor and the second conductor is 95%, arranging n detection portions in series results in the following: the detection rate $[\%]=\{1\times(0.05)^n\}\times 100$. By providing three to five junctions of the first conductors and the second conductors, a high detection rate can be obtained.

Figure 7:
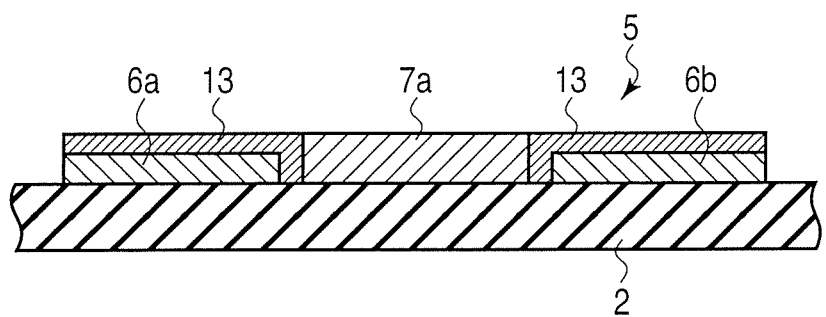
FIG. 7 is a cross-sectional view showing another aspect of the detector of the module according to the first embodiment.

(3) The detector 5 shown in FIG. 7 has a structure in which Au layers (or Ag layers) 13, which are third conductors, are interposed between the first conductor 6a and the second conductor 7 and between the second conductor 7 and the first conductor 6b. The Au layer (or the Ag layer) 13 can be formed by applying Au plating or Ag plating to the top surfaces of the first conductors 6a and 6b including their interfaces with the second conductor 7.

With such detector 5, the speed of diffusion of Au or Ag to tin alloy solder is higher than that of Cu. That is, the speed of diffusion of Au or Ag from the Au layer (or Ag layer) 13 to the second conductor 7 increases. This makes faster the growth of an intermetallic compound layer between the Au layer (or Ag layer) 13 of the first conductors 6a and 6b and the second conductor 7. As a result, formation and growth of Kirkendall voids are promoted, which increases the speed of breakage of the junction. Early detection is thus enabled.

Figure 8:
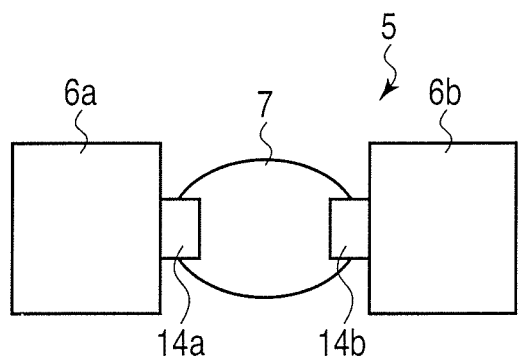
FIG. 8 is a plan view showing another aspect of the detector of the module according to the first embodiment.

(4) The detector 5 in FIG. 8 has a structure in which rectangular projections 14a and 14b made of Cu extend integrally from the first conductors 6a and 6b, respectively, toward the second conductor 7 such that the projections 14a and 14b are bonded to the second conductor 7. The detector 5 of FIG. 9 has a structure in which triangular projections 15a and 15b made of Cu extend integrally from the first conductors 6a and 6b, respectively, toward the second conductor 7 such that the projections 15a and 15b are bonded to the second conductor 7, which makes smaller the junction areas of the projections 15a and 15b with the second conductor 7 than those in the detector 5 in FIG. 8.

The detector 5 shown in FIG. 9 has smaller junction areas of the triangular projections 15a and 15b made of Cu with the second conductor 7 made of tin alloy solder than those in the detector 5 shown in FIG. 8, which leads to small areas of the intermetallic compound layers generated between them. This results in an increased speed of junction breakage arising from formation and growth of Kirkendall voids and electromigration. Early detection is thus enabled.

(5) FIG. 10 shows the module 1 in which a battery connector 21, a power source connector 22 and a CPU 23 are mounted on the circuit substrate 2. In this module 1, as shown in FIG. 11, the detector 5 is disposed on the circuit substrate 2 under the CPU 23 where current is large, and the amount of heat generation is also large. Note that the CPU 23 comprises a plurality of electrodes 24, and the electrodes 24 are connected through gold bumps 25 to the circuit patterns 3 on the circuit substrate 2.

In the module 1 shown in FIG. 11, the detector 5 is heated by the heat generation of the CPU 23. In a first conductor made of copper and a second conductor made of tin alloy solder that are included in the detector 5, when temperature is high, motion of atoms is more active, and the speed of diffusion is faster. For this reason, the growth of the intermetallic compound layer between the first conductor and the second conductor becomes faster. This results in an increased speed of junction breakage arising from formation and growth of Kirkendall voids and electromigration. The increased accuracy of detection by the detector 5 can thus be achieved.

Note that placement of the detector is not limited to a position directly under the CPU, and the detector may be placed in the vicinity of the battery connector 21 or the power source connector 22, which has a large amount of heat generation, on the circuit substrate 2.

(6) The module 1 shown in FIG. 12 comprises the circuit substrate 2, and a BGA substrate 28 whose top surface comprises a semiconductor chip 26 bonded thereto and whose bottom surface comprises a plurality of electrodes 27, and has a structure in which the electrodes 27 on the BGA substrate 28 are bonded to the circuit patterns 3 of the circuit substrate 2 with a plurality of bumps 29 made of tin alloy solder (e.g., $Sn_{3.0}Ag_{0.5}Cu$ solder) interposed therebetween. In the module 1, the first conductors 6a and 6b made of copper are disposed at a desired distance from each other on the circuit substrate 2, and the first conductors 6a and 6b and the electrode 27 on the BGA substrate 28 are bonded with the bump 29 made of tin alloy solder (e.g., $Sn_{3.0}Ag_{0.5}Cu$ solder) interposed therebetween. That is, the detector 5 has a structure in which the bump 29 made of tin alloy solder as the second conductor is bonded between the first conductors 6a and 6b.

In the module 1 shown in FIG. 12, the semiconductor chip 26 on the BGA substrate 28 generates heat to high temperature during operation, which heats the bump 29 (second conductor) made of tin alloy solder of the detector 5 positioned under the semiconductor chip 26 with the BGA substrate 28 interposed therebetween. In the bump 29 (second conductor) made of tin alloy solder, when temperature is high, motion of atoms is more active, and the speed of diffusion is faster. For this reason, the growth of the intermetallic compound layers between the first conductors 6a and 6b and the bump 29 (second conductor) becomes faster. This results in an increased speed of junction breakage arising from formation and growth of Kirkendall voids and electromigration. The increased accuracy of detection by the detector 5 can thus be achieved.

Note that a structure shown in FIG. 13 may be adopted as the structure in which the detector is disposed on the circuit substrate under the BGA substrate. The first conductors 6a and 6b made of copper are disposed at a desired distance from each other on the circuit substrate 2. The first conductors 6a and 6b and the electrodes 27 on the BGA substrate 28 are bonded with the bumps 29 made of tin alloy solder (e.g., $Sn_{3.0}Ag_{0.5}Cu$ solder), which are interposed therebetween. The bumps 29 are connected to each other through an interconnect 30 inside of the BGA substrate 28. That is, the detector 5 of the module 1 shown in FIG. 13 has a structure in which the first conductors 6a and 6b are bonded via the bump 29 made of tin alloy solder as the second conductor, the electrode 27, the interconnect 30, the electrode 27, and the bump 29 made of tin alloy solder as the second conductor.

Also, in the structure in which the detector is disposed on the circuit substrate under the BGA substrate shown in FIG. 12, a plurality of detectors 5, for example, five detectors 5, may be disposed on the circuit substrate 2 under the BGA substrate 28 as shown in FIG. 14.

In the module 1 shown in FIG. 14, providing the plurality of detectors 5 on the circuit substrate 2 under the BGA substrate 28 allows the accuracy in detecting breakage of the junction between the first conductor and the second conductor to be more enhanced.

Further, as shown in FIG. 15, a structure in which a detector is disposed on the BGA substrate may be adopted. That is, a plurality of top surface electrodes 31 made of copper is formed on the front surface of the BGA substrate 28. The first conductors 6a and 6b made of copper are formed at a desired distance from each other on the front surface of the BGA substrate 28. The plurality of electrodes 27 is formed on the back surface of the BGA substrate 28. The tin alloy solder balls (bumps) 29 connected to the circuit pattern of a circuit substrate, which is not shown, are bonded to the electrodes 27. A plurality of electrodes 32 is formed on the bottom surface of the semiconductor chip 26. A barrier metal layer 33 is formed on the bottom surface of each electrode 32. The top surface electrodes 31 of the BGA substrate 28 are bonded to the barrier metal layers 33 of the semiconductor chip 26 with a plurality of bumps 34 made of tin alloy solder (e.g., $Sn_{3.0}Ag_{0.5}Cu$ solder). The first conductors 6a and 6b on the top surface of the BGA substrate 28 and the barrier metal layer 33 of the semiconductor chip 26 are bonded with the bump 34 made of tin alloy solder (e.g., $Sn_{3.0}Ag_{0.5}Cu$ solder), which are interposed therebetween. That is, the detector 5 has a structure in which the bump 34 made of tin alloy solder as the second conductor is bonded between the first conductors 6a and 6b.

In the module 1 shown in FIG. 15, the semiconductor chip 26 generates heat to high temperature during operation, thereby heating the bump 34 (second conductor) made of tin alloy solder of the detector 5 positioned directly under the semiconductor chip 26. A higher temperature load is imposed, motion of atoms is more active, and therefore the speed of diffusion is higher in the bump 34 (second conductor) made of tin alloy solder than in the above-described bump 29 (second conductor) made of tin alloy solder shown in FIG. 12. Accordingly, the growth of the intermetallic compound layers between the first conductors 6a and 6b and the bump 34 (second conductor) becomes faster. This results in an increased speed of junction breakage arising from formation and growth of Kirkendall voids and electromigration. The increased accuracy in detecting the breakage of junctions by the detector 5 can thus be achieved.

(7) The detector 5 of the module 1 shown in FIG. 16 includes the first conductors 6a and 6b made of copper, and a second conductor 35 disposed between the first conductors 6a and 6b and made of a conductive adhesive.

In the module 1 shown in FIG. 16, when a current is passed between the first conductors 6a and 6b, the second conductor 35 made of the conductive adhesive deteriorates with time to be peeled from the first conductors 6a and 6b. For example, when peeling occurs between the second conductor 35 and the first conductor 6b, conduction between them cannot be achieved. This state is detected by a measuring instrument that is not shown. As a result, a failure of the circuit substrate including the bonding member between the circuit pattern and the active elements, such as a CPU, a memory and a BGA, can be forecast.

In general, according to a second embodiment, an electronic device comprises an enclosure and a module mounted within the enclosure. The module comprises a circuit substrate comprising a circuit pattern which is formed of a first conductor and which includes a signal circuit, a bonding member formed of a second conductor different from the first conductor, a passive element and an active element bonded to the circuit pattern with the bonding member to implement the circuit substrate, and a detection circuit provided separately from the signal circuit on the circuit substrate. The detection circuit comprises a detector including the first conductor and the second conductor which are provided on the circuit substrate and which are electrically connected to each other, a power source configured to supply current to the detector, and a measuring instrument interposed between one of the first and the second conductors of the detector and the power source and configured to measure electrical characteristics between the first and the second conductors.

FIG. 17 is a perspective view showing an electronic device, for example, a notebook computer, according to the second embodiment.

A portable computer 41 comprises a device body 42, and a display unit 43 supported by the device body 42. The device body 42 comprises an enclosure 44. The enclosure 44, which comprises a rectangular base 45 and an approximately rectangular cover 46 fitted thereinto, is formed in the shape of a flat box.

The cover 46 included in the enclosure 44 is formed of a resin having optical transparency, such as acrylic. An approximately rectangular opening 47 is formed from the central portion to the rear half of the cover 46. A keyboard 48 is provided to be exposed within the opening 47.

The above-described module 1 is mounted on the base 45 under the keyboard 48. Approximately the front half of the cover 46 forms a palm rest 49. An opening 50 is formed in a central portion of the palm rest 49. A track pad 51 is provided to be exposed within the opening 50. An opening 52 is formed in front of the track pad 51 in the palm rest 49. A decision switch 53 is provided to be exposed within the opening 52. An opening 54 is formed to the left of the decision switch 53 in the palm rest 49. A fingerprint read portion 55 is provided in the opening 54.

The display unit 43 comprises a display housing 56 and a liquid crystal panel 57 contained in the display housing 56. The display housing 56 is supported rotatably with respect to the enclosure 44 of the device body 42 by a pair of hinges 58. A display window 59 is formed on the front wall of the display housing 56. The window 59 has a size covering most of the front wall. The display screen of the liquid crystal panel 57 is exposed outside of the display housing 56 through the window 59.

The module 1 mounted within the above-mentioned enclosure 44 comprises the detection circuit 4 that is different from the signal circuit formed on the circuit substrate 2 as shown in the aforedescribed FIGS. 1 and 2. The detection circuit 4 comprises the detector 5. The detector 5 is constituted with the two first conductors 6a and 6b and the second conductor 7 formed on the circuit substrate 2, respectively, as described above. The second conductor 7 is disposed between the first conductors 6a and 6b so as to electrically connect to the first conductors 6a and 6b. The first conductors 6a and 6b are made of the same material as that, i.e., copper, of the circuit pattern 3. The second conductor 7 is made of the same material as that, i.e., tin alloy solder (e.g., $Sn_{3.0}Ag_{0.5}Cu$ solder), of the bonding member, which is a different kind of metal from that of the first conductors 6a and 6b. The first conductor 6a is connected to land 8a, into which one terminal of the power source (not shown) is inserted, through a circuit pattern 9a that is different from the signal circuit. First conductor 6b is connected to a land 8b, into which the other terminal of the power source (not shown) is inserted, through the circuit pattern 9b that is provided separately from the signal circuit. The measuring instrument 10 for measuring current among the first conductor 6a, the second conductor 7 and the first conductor 6b is interposed on the circuit pattern 9b between the first conductor 6b and the land 8b.

The portable computer 41 according to the second embodiment shown in FIG. 17 has mounted thereon the module 1 in which the detection circuit 4 is provided on the circuit substrate 2. This enables forecast of a failure of the circuit substrate 2 including a bonding member between a circuit pattern and active elements, such as a CPU, a memory and a BGA. Consequently, improved reliability and increased safety of the portable computer 41 can be achieved.

Further, when the above-described module 1 comprising the detector 5 shown in FIGS. 6, 7 and 9 is mounted within the enclosure 44, a failure of the circuit substrate 2 can be forecast rapidly and with good accuracy. A portable computer having still higher reliability and safety can therefore be provided.

Note that the electronic device according to the second embodiment can be applied not only to a notebook computer but also to cellular phones, microcellular phones and video camcorders.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A module comprising:
    a circuit substrate comprising a circuit pattern which is formed of a first conductor;
    a bonding member formed of a second conductor different from the first conductor;
    a passive element and an active element bonded to the circuit pattern with the bonding member to implement the circuit substrate; and
    a detection circuit provided separately from a signal circuit on the circuit substrate, wherein the detection circuit comprises:
        a detector including the first conductor and the second conductor which are provided on the circuit substrate and which are electrically connected to each other;
        a power source configured to supply current to the detector; and
        a measuring instrument connected to one of the first and the second conductors in the detector and the power source, the measuring instrument configured to measure electrical characteristics between the first and the second conductors.

2. The module of claim 1, wherein the first conductor is made of copper, the second conductor is made of tin alloy solder.

3. The module of claim 1, further comprising a third conductor layer which is plated with gold or silver and which covers at least an interface between the first conductor and the second conductor.

4. The module of claim 1, wherein the detector comprises two first conductors and the second conductor which is disposed between the first conductors so as to electrically connect to the first conductors.

5. The module of claim 1, wherein the active element is an electronic component which is bonded with the second conductor of the detector.

6. The module of claim 1, wherein the detector consists of a plurality of the detectors which are formed so as to connect each other in series on the circuit substrate.

7. The module of claim 1, wherein the measuring instrument is a current measuring instrument.

8. The module of claim 1, wherein the first conductor is made of copper, the second conductor is made of a conductive adhesive.

9. An electronic device comprising an enclosure and a module mounted within the enclosure, the module comprising:
    a circuit substrate comprising a circuit pattern which is formed of a first conductor;
    a bonding member formed of a second conductor different from the first conductor;
    a passive element and an active element bonded to the circuit pattern with the bonding member to implement the circuit substrate; and
    a detection circuit provided separately from a signal circuit on the circuit substrate, wherein the detection circuit comprises:
        a detector including the first conductor and the second conductor which are provided on the circuit substrate and which are electrically connected to each other;
        a power source configured to supply current to the detector; and
        a measuring instrument connected to one of the first and the second conductors of the detector and the power source, the measuring instrument configured to measure electrical characteristics between the first and the second conductors.

10. The electronic device of claim 9, wherein the first conductor is made of copper, the second conductor is made of tin alloy solder.

11. The electronic device of claim 9, further comprising a third conductor layer which is plated with gold or silver and which covers at least an interface between the first conductor and the second conductor.

12. The electronic device of claim 9, wherein the detector comprises two first conductors and the second conductor which is disposed between the first conductors so as to electrically connect to the first conductors.

13. The electronic device of claim 9, wherein the active element is an electronic component which is bonded with the second conductor of the detector.

14. The electronic device of claim 9, wherein the detector consists of a plurality of the detectors which are formed so as to connect each other in series on the circuit substrate.

15. The electronic device of claim 9, wherein the measuring instrument is a current measuring instrument.

16. The electronic device of claim 9, wherein the first conductor is made of copper, the second conductor is made of a conductive adhesive.

* * * * *